April 20, 1965 H. W. BLOOM 3,179,894
TRANSISTOR AMPLIFIER
Filed Sept. 24, 1962
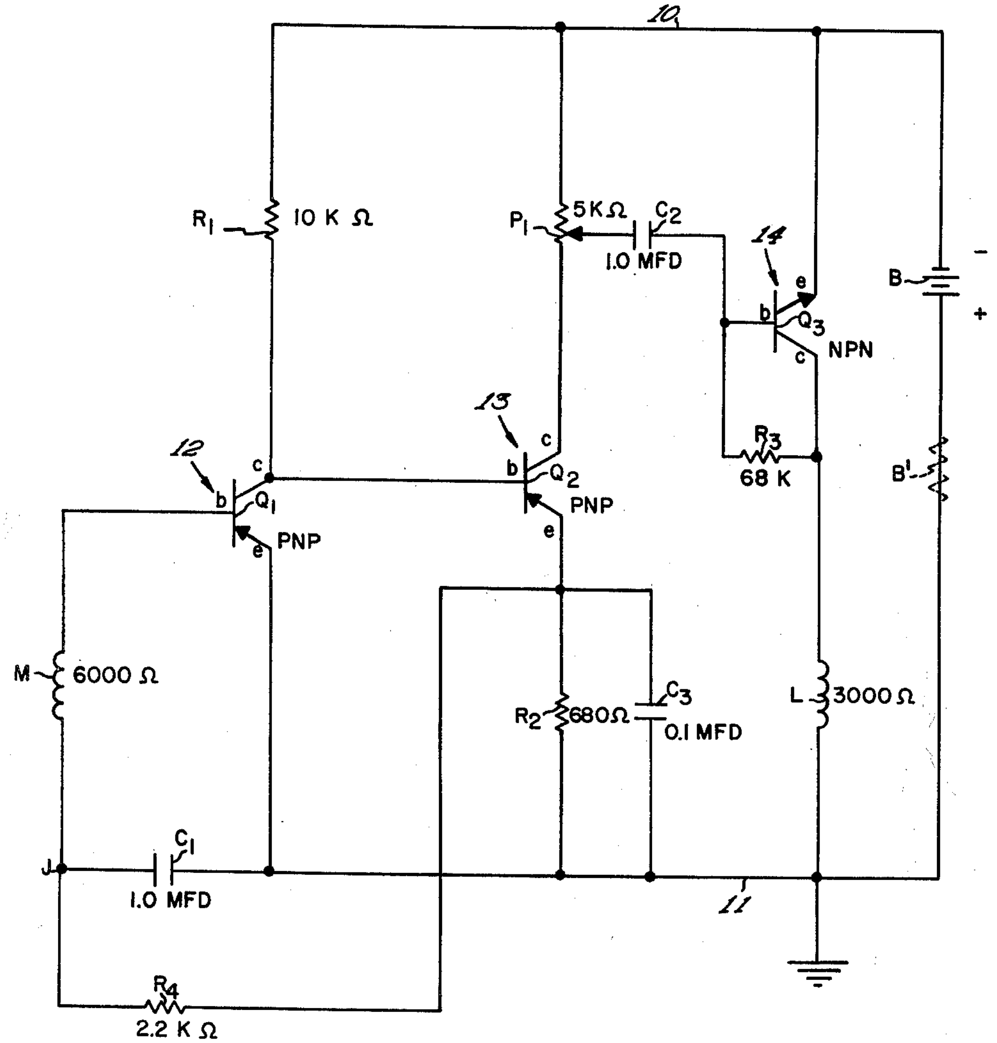
INVENTOR
HOWARD W. BLOOM
BY
Williamson & Palmatier
ATTORNEYS

United States Patent Office 3,179,894
Patented Apr. 20, 1965

3,179,894
TRANSISTOR AMPLIFIER

Howard W. Bloom, Minneapolis, Minn., assignor to Maico Electronics, Inc., Minneapolis, Minn., a corporation of Minnesota Filed Sept. 24, 1962, Ser. No. 225,756
2 Claims. (Cl. 330—25)

This invention relates to an audio amplifier circuit and more particularly to a circuit having a minimum number of components so as to be adapted for substantial miniaturization.

In order to produce a hearing aid small enough to be fitted into a person's ear, it is necessary that the number of components in the hearing aid be reduced to a minimum. Certain space is required by the small battery, volume control, microphone and receiver, but it is necessary that the amplifier be kept as small as possible so as to make possible the production of such a hearing aid. Although size of the amplifier is important, quality and control of the sound reproduction under the conditions to be encountered continue to be important factors.

An object of my invention is to provide a new and improved transistor amplifier of simple and inexpensive construction and operation.

Another object of my invention is to provide a novel transistor amplifier employing a minimum number of components while reproducing amplified sounds with low distortion.

A further object of my invention is the provision of an improved and novel transistor amplifier which is adapted for substantial miniaturization and which may be inexpensively produced with randomly selected transistors by compensating between the transistors for variations in the characteristics thereof.

These and other objects and advantages of my invention will more fully appear from the following description made in connection with the accompanying drawing wherein like reference characters refer to similar parts and wherein the drawing is a schematic diagram of the present invention.

One form of the present invention is shown in the drawing and is described herein.

The amplifier circuit shown is primarily adapted for use in connection with a hearing aid of such a size as to be adapted to be confined partially within a person's ear. The transistor amplifier includes a B-line 10 and a ground line 11, which are respectively connected to the negative and positive terminals of a small battery B which contains a finite impedance shown in dotted lines and indicated by the letter B'. The amplifier includes three stages of amplification indicated in general by numerals 12, 13 and 14 respectively and which employ junction transistors $Q_1$, $Q_2$ and $Q_3$. The base, collector and emitter electrodes of each of the transistors are designated *b, c* and *e* respectively.

It is important to note at the outset that the first and second stage transistors $Q_1$ and $Q_2$ are type PNP transistors and that the 3rd or output amplification stage transistor $Q_3$ is a type NPN transistor.

The collector *c* of transistor $Q_1$ is connected through a load resistor $R_1$, to the B-line 10. The resistor $R_1$, in addition to providing the collector load, also provides bias for the second stage transistor $Q_2$. The emitter *e* of the first stage resistor $Q_1$ is connected directly to the ground line 11. The base *b* of transistor $Q_1$ is connected through the input microphone coil M to the junction point J, and it will be seen that the junction point J is connected by condenser $C_1$ to the ground line 11. Although the junction point J is not at the ground D.C. potential, the condenser $C_1$ offers a minimum of impedence to audio A.C. signals and the junction point J is therefore substantially at ground for A.C. signals.

The second amplification stage 13 is direct coupled to the input or first amplification stage 12 and has the base *b* of transistor $Q_2$ connected directly to the collector *c* of the input stage transistor $Q_1$. The emitter *e* of transistor $Q_2$ is connected through the bias resistor $R_2$ to the ground line. The resistor $R_2$ provides bias for the input stage transistor $Q_1$. It will be noted that a tone control condenser $C_3$ is connected in parallel with the resistor $R_2$. Although it is desirable in many instances to employ the tone control condenser $C_3$, this condenser is not essential to the operation of the circuit.

The gain control for the amplifier circuit is provided by potentiometer $P_1$, the opposite ends of which are connected to the B-line 10 and the collector *c* of transistor $Q_2$. The potentiometer $P_1$ provides the load resistor of the second amplification stage 13.

The movable center tap of potentiometer $P_1$ is connected through a coupling condenser $C_2$ to the base *b* of the NPN output stage transistor $Q_3$. The collector *c* of the NPN transistor $Q_3$ is connected through the output impedance coil L to the ground line 11. The coil L is the receiver coil for reproducing the amplified sound. It will be noted that a bias resistor $R_3$ is connected between the base *b* and collector *c* of the NPN transistor $Q_3$. The emitter *e* of the output stage NPN transistor is connected directly to the B-line 10. It should be noted at various times during the life of battery B the impedence B' thereof will vary between approximately 3 and 15 ohms.

The use of the NPN transistor $Q_3$ in the output stage 14 also allows the collector load resistor $P_1$ of the second amplification stage 13 to be used as the gain control. The potentiometer, considered together with the condenser $C_2$ provides RC coupling between the second and output stages and the potentiometer $P_1$ permits extremely low impedence to be obtained between the base *b* and emitter *e* of the NPN transistor $Q_3$, to thereby allow a wide range of gain control.

It is particularly important to note with regard to this transistor amplifier that the number of individual components is at a very minimum and the amplifier may be arranged to occupy an extremely small space. The amplifier, not including the volume control, which must be large enough to be manually manipulated and further excluding the microphone, receiver and battery, has been constructed to occupy a space not in excess of the dimensions 0.100 by 0.150 by 0.400 inch, or as expressed in terms conventional to the trade, there may be 167 amplifiers per cubic inch. Another important aspect of the present invention is the provision of the D.C. feedback circuit comprising resistor $R_4$ connected between the junction point J and the emitter *e* of transistor $Q_2$. By the use of the D.C. feedback, compensation is provided for the varying characteristics between the first and second stage transistors $Q_1$ and $Q_2$. The actual transistors to be employed in the first and second stages 12 and 13 need not be carefully selected and may be randomly selected from a number of PNP transistors. Matching of the transistors in the first and second stages is unnecessary because of the compensation provided by the D.C. feed back through the resistor $R_4$. In the event that the ambient temperatures in which the amplifier operates vary over a wide range, any dissimilar variance in the characteristics of the transistor $Q_1$, due to the changing temperatures is compensated for by the D.C. feedback through resistor $R_4$. For instance, in the event that due to a temperature change, the D.C. emitter to collector current in transistor $Q_1$ increases, the bias applied to the base of transistor $Q_2$ is changed so as to decrease the D.C. emitter to collector current in the transistor $Q_2$, and as a result, the D.C. potential at the emitter *e* at the transistor $Q_2$ decreases, and the potential at the junction point J and the base *b* of transistor $Q_1$ is similarly decreased so as to again return the emitter to collector current of transistor $Q_1$ to substantially normal condition.

It will be seen that I have provided a novel transistor amplifier circuit utilizing a minimum number of components, but constructed in such a manner as to permit the collector load of the penultimate stage to be employed as the gain control which permits variance of the gain over a wide range; and further wherein transistors for use in the first and second stages may be randomly selected and therefore inexpensively acquired.

It will, of course, be understood that various changes may be made in the form, details, arrangement and propositons of the parts without departing from the scope of my invention which consists of the matter shown and described herein and set forth in the appended claims.

What is claimed is:

1. A quality audio amplifier adapted for miniaturization with a minimum number of components,
   comprising a B-line, a ground line, and a battery having finite impedance and having its terminals respectively connected to said lines;
   a first stage PNP transistor with its emitter connected directly to ground; its collector connected through a load resistor to the B-line; and its base connected in series through an input coil, a first junction point and a signal grounding condenser to the ground line;
   a second stage PNP transistor with its base connected directly to the collector of the first stage transistor; its collector connected through a gain control potentiometer to the B-line; and with its emitter connected through a first biasing resistor to the ground line and with its emitter also connected through a resistor to said first junction point to feed back D.C. compensating bias to said first stage transistor to compensate for the varying effects of temperature changes on said PNP transistors;
   and an output stage NPN transistor with its base connected through a coupling condenser to the wiper of the gain control potentiometer and with its base also connected through a bias resistor to the collector of the NPN transistor; with its collector connected through an output coil to the ground line; and with its emitter connected direct to the B-line;
   whereby to achieve high gain and gain control over a wide range at low collector currents and with low distortion while maintaining a wide temperature range through the provision of D.C. compensating bias.

2. An audio amplifier adapted for a minimum number of components,
   comprising a B-line, a ground line, and a battery with impedance and having its terminals respectively connected to said lines,
   transistor circuit means defining a first stage of amplification and including a load resistor connected between the collector and the B-line and also including means connecting the emitter to the ground line and input means connected between the base and the ground line and applying input signal to said first stage,
   transistor circuit means defining a second stage of amplification and including a PNP transistor coupled to said first stage and including a gain control potentiometer connected between the B-line and the collector of said transistor and also including means connecting the ground line with the emitter of said transistor,
   and transistor circuit means defining an output stage of amplification and including an NPN transistor coupled through the wiper of said potentiometer to said second stage, the emitter of said NPN transistor being connected direct to the B-line and an output coil connected between the collector of said NPN transistor and the ground line.

References Cited by the Examiner

UNITED STATES PATENTS

| | | | |
|---|---|---|---|
| 2,927,275 | 3/60 | Herrmann et al. | 330—17 |
| 3,008,091 | 11/61 | Van Overbeek et al. | 330—17 |
| 3,031,627 | 4/62 | Reichert et al. | 330—26 X |

ROY LAKE, *Primary Examiner.*

NATHAN KAUFMAN, *Examiner.*